United States Patent
Chia et al.

(10) Patent No.: US 6,525,421 B1
(45) Date of Patent: Feb. 25, 2003

(54) MOLDED INTEGRATED CIRCUIT PACKAGE

(75) Inventors: Chok J. Chia, Cupertino, CA (US); Seng S. Lim, San Jose, CA (US); Wee K. Liew, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/846,080

(22) Filed: May 1, 2001

(51) Int. Cl.[7] ............................................... H01L 23/04
(52) U.S. Cl. ........................ 257/730; 257/706; 257/707; 257/778; 438/108; 438/122; 438/125
(58) Field of Search ................................. 257/706, 707, 257/730, 778, 720; 438/122, 125, 108

(56) References Cited

U.S. PATENT DOCUMENTS

| | | | | |
|---|---|---|---|---|
| 5,172,213 A | * | 12/1992 | Zimmerman | 257/796 |
| 5,216,278 A | * | 6/1993 | Lin et al. | 257/688 |
| 5,216,283 A | * | 6/1993 | Lin | 257/787 |
| 5,705,851 A | * | 1/1998 | Mostafazadeh et al. | 257/707 |
| 5,977,626 A | * | 11/1999 | Wang et al. | 257/707 |
| 6,215,180 B1 | * | 4/2001 | Chen et al. | 257/720 |

* cited by examiner

*Primary Examiner*—David Nelms
*Assistant Examiner*—Andy Huynh
(74) *Attorney, Agent, or Firm*—Luedeka, Neely & Graham, P.C.

(57) ABSTRACT

A mold for use in encapsulating an integrated circuit, wherein an encapsulant is injected into the mold during packaging of the integrated circuit. The improvement to the mold is a shaped member having an abutting surface for contacting a surface of the integrated circuit and thereby substantially preventing encapsulant from adhering to the surface of the integrated circuit, whereby the surface of the integrated circuit is left exposed. Because the surface of the integrated circuit is left exposed, the encapsulant used to encapsulate the integrated circuit does not form a thermal barrier between the integrated circuit and the exterior of the package. Thus, the packaged integrated circuit is able to more efficiently conduct heat away from the integrated circuit.

5 Claims, 3 Drawing Sheets

MOLDED INTEGRATED CIRCUIT PACKAGE

FIELD

This invention relates to the field of integrated circuits. More particularly this invention relates to increasing the thermal dissipation capacity of integrated circuit packages.

BACKGROUND

Integrated circuits, specifically monolithic integrated circuits, are typically packaged prior to use. The package provides a variety of benefits for the use of the integrated circuit. For example, the package tends to protect the integrated circuit from physical damage, such as chemical damage that may result from contact between the integrated circuit and materials in a corrosive environment, or mechanical damage that may result from the integrated circuit being forcefully contacted during shipping, use, or other handling.

The package for an integrated circuit may also provide the additional benefit of making electrical contact to the integrated circuit much easier to accomplish. This is generally done by providing electrical continuity between the very small and closely spaced electrical contacts on the integrated circuit and relatively larger and farther spaced electrical contacts on the outside of the package.

As integrated circuits operate, they tend to consume an amount of electricity that is used to operate the various electrical components of the integrated circuit. As the speed of integrated circuits increases, so also does the amount of electricity which they consume increase. The electricity consumed by an integrated circuit tends to be predominantly discarded as heat. Thus, as the speed of integrated circuits has increased, so to has the amount of heat which the integrated circuits produce increased.

Some integrated circuit manufacturing methods use molds to form the integrated circuit packages. The protective coatings of the package typically completely encompass the integrated circuit, wire bonds, and electrical contacts of the integrated circuit carrier or substrate. Unfortunately, the protective coatings also tend to function as an insulating layer, and may substantially impede thermal dissipation from the integrated circuit. Thus, the heat dissipation of such integrated circuit packages is degraded due to the configuration of the protective coatings of the package.

What is needed therefore, is system for protecting the sensitive components of the integrated circuit package without unduly impeding the heat dissipation capacity of the integrated circuit package.

SUMMARY

The above and other needs are provided by a mold for use in encapsulating an integrated circuit, wherein an encapsulant is injected into the mold during the manufacture of the integrated circuit. The improvement to the mold is a shaped member having an abutting surface for contacting a surface of the integrated circuit and thereby substantially preventing encapsulant from adhering to the surface of the integrated circuit, whereby the surface of the integrated circuit is left exposed.

Because the surface of the integrated circuit is left exposed, the encapsulant used to encapsulate the integrated circuit does not form a thermal barrier between the integrated circuit and the exterior of the package. Thus, the packaged integrated circuit is able to more efficiently conduct heat away from the integrated circuit.

In various preferred embodiments, only a portion of the surface of the integrated circuit is left exposed. Most preferably, any electrical connections on the surface of the integrated circuit are sealed within the encapsulant and not left exposed. The shaped member may be either an integral part of the mold, or a mold insert. In a most preferred embodiment the shaped member is formed of silicone.

In another aspect, the invention includes an integrated circuit packaged in an encapsulant, where the improvement is a void formed in the encapsulant, whereby at least a portion of a surface of the integrated circuit is exposed through the void in the encapsulant. In various embodiments, the integrated circuit may be either a flip-chip or a wire bonded chip. Further, a thermally conductive material may be disposed within the void formed within the encapsulant. The thermally conductive material preferably forms a heat conduction path to conduct heat away from the integrated circuit. In a most preferred embodiment, a heat sink is disposed adjacent the thermally conductive material. The heat sink absorbs and dissipates the heat conducted through the thermally conductive material.

In yet another aspect, the invention includes a method of packaging an integrated circuit in an encapsulant, where the improvement is the step of forming a void in the encapsulant, whereby at least a portion of a surface of the integrated circuit is exposed through the void formed in the encapsulant.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
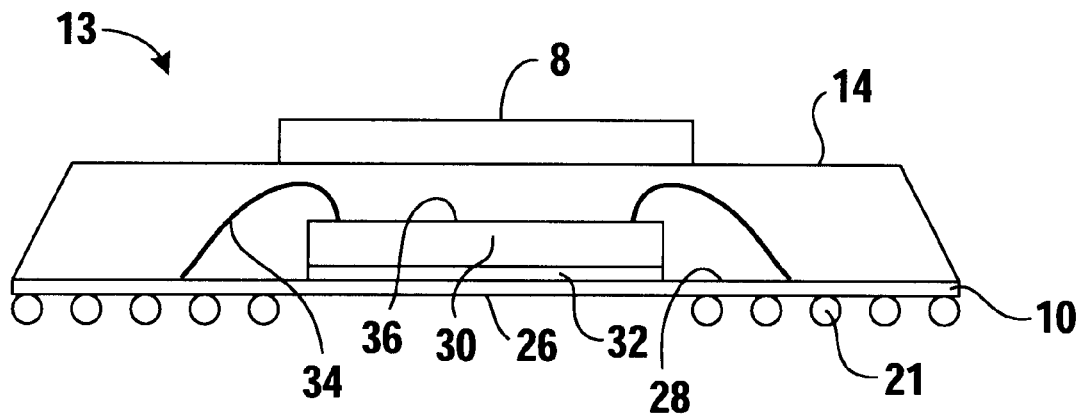
FIG. 1 is a cross-sectional view of a prior art integrated circuit package including a molded body.

Referring now to FIG. 1 there is shown a cross-sectional view of a conventional integrated circuit package 13, including a molded body 14. The integrated circuit package 13 includes a substrate 26 whereupon one or more electrical interconnection systems 28 are disposed. A integrated circuit 30 is disposed upon a substrate 26, and a layer of material 32 adheres the integrated circuit 30 to the substrate 26. A plurality of wires 34 electrically connect contacts located on the top surface 36 of the integrated circuit 30 to the electrical interconnection systems 28.

As depicted, the molded body 14 completely encompasses the integrated circuit 30. The molded body 14 protects the electrical components of the integrated circuit package 13 from contamination and unwanted interaction with other electrical systems. However, due to the material properties of the molded body 14, which generally include a relatively low thermal conductivity, the molded body 14 also operates as an insulating layer, limiting the thermal dissipation capacity of the integrated circuit package 13. Due to the molded body 14's low thermal conductivity, heat dissipation from the integrated circuit 30 to any external heat sink, such as the ambient environment or heat sink 8, is substantially reduced. Since the integrated circuit package 13 tends to be unable to efficiently conduct heat away from the integrated circuit 30, the life expectancy and operation of the integrated circuit package 13 is typically compromised.

Figure 2:
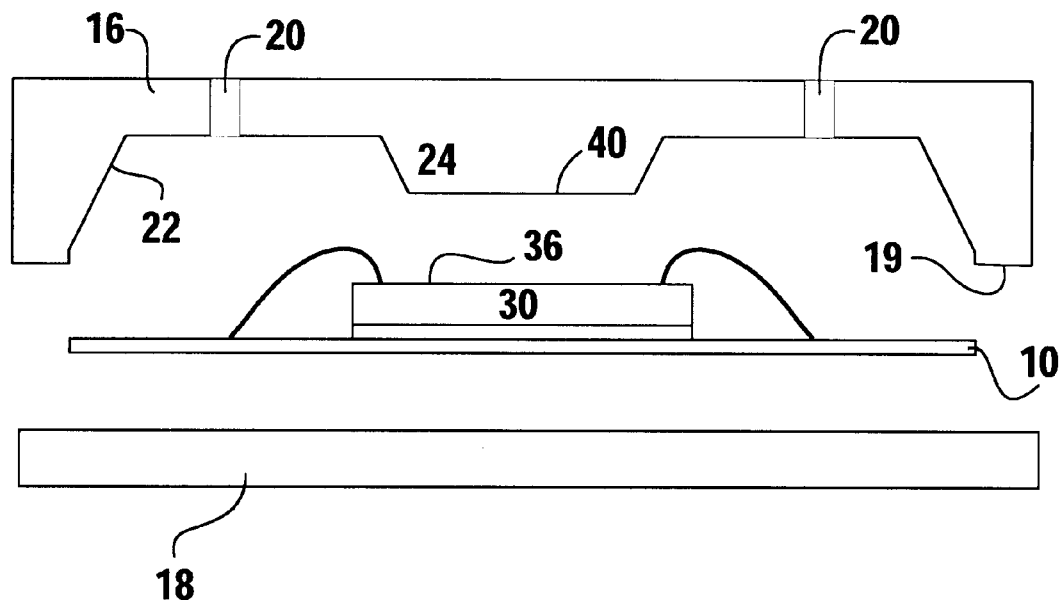
FIG. 2 is a cross-sectional view of an open mold and partially completed integrated circuit package in accordance with the invention.
Figure 3:
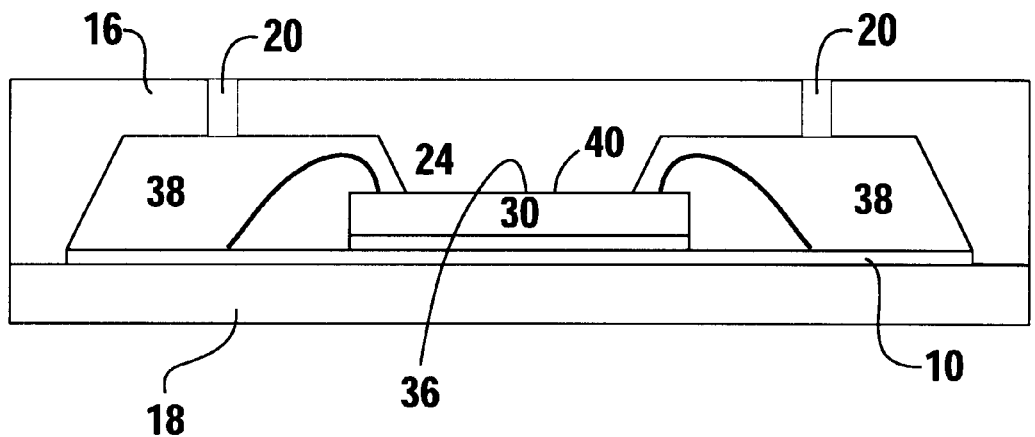
FIG. 3 is a cross-sectional view of the closed mold encompassing the partially completed integrated circuit package in preparation for injecting encapsulant therein, in accordance with the invention.

With reference now to FIGS. 2 and 3, there is depicted a cross-sectional view of a partially completed integrated circuit package 10 and a mold in accordance with a preferred embodiment of the invention. FIGS. 2 and 3 depict the partially completed integrated circuit package 10 before the mold is used to create a protective molded body 14. As described in greater detail below, the mold is preferably designed to create a protective molded body 14 that does not tend to degrade the thermal dissipation capacity of the complete integrated circuit package 13.

Once the mold is used to create the protective molded body 14, preferably during a latter manufacturing step, a complete integrated circuit package 13 is provided according to the manufacturing process. As described in greater detail below, the mold includes the structural features that define the structural topography of the protective molded body 14 when the mold is utilized during the manufacture of the integrated circuit package 13.

With continuing reference to FIGS. 2 and 3, the mold includes a top mold piece 16 and a bottom mold piece 18. During the manufacturing process, the top and bottom mold pieces 16 and 18 are located adjacent a partially completed integrated circuit package 10. The top and bottom mold pieces 16 and 18 are constructed so that when the top and bottom mold pieces 16 and 18 are placed around a partially completed integrated circuit package 10, the partially completed integrated circuit package 10 is fully preferably encompassed by the mold pieces 16 and 18. However, other configurations of the top mold piece 16 and bottom mold piece 18 which do not completely encompass the partially completed integrated circuit package 10 are also contemplated, such as those in which the bottom mold piece 18 does not completely enclose the bottom of the partially completed integrated circuit package 10.

The bottom mold piece 18 is preferably a substantially flat planar surface, providing a supporting base for the partially completed integrated circuit package 10 and the peripheral surfaces 19 which extend from the top mold piece 16. Alternately, the inner surface of the bottom mold piece 18 is adapted to fit the configuration of the bottom of the substrate 26, in those cases where the bottom of the substrate 26 is not flat.

The top mold piece 16 preferably includes a means for injecting an encapsulant into the mold, such as one or more through-holes 20 extending through the top mold piece 16. The encapsulant may be in either a completely liquefied state or in a thixotropic state. The top mold piece 16 preferably also includes a lower formation surface 22, bounded by the peripheral surfaces 19. The lower formation surface 22 of the top mold piece 16 includes the structure that defines the topographical features of the protective molded body 14 during the molding process. As described in more detail below, the lower formation surface 22 of the top mold piece 16 preferably includes a shaped member 24 for defining additional features of the protective molded body 14. Most preferably the shaped member 24 is formed of silicone, but may alternately be composed of other materials that are compatible with the processes and elements as described herein.

Alternatively, the shaped member 24 is a separate component distinct from the mold. In this arrangement, the shaped member 24 is strategically located adjacent the partially completed integrated circuit package 10 before disposing the mold to encompass the shaped member 24 and the partially completed integrated circuit package 10. As described further below, the dimensions of the shaped member 24 correspond to the type of integrated circuit package 13 being manufactured.

The top and bottom mold pieces 16 and 18 are located to encompass the partially completed integrated circuit package 10 in preparation for injecting the encapsulant therein, as depicted in FIG. 3. The partially completed integrated circuit package 10 is located on top of the bottom mold piece 18. Thereafter, the top mold piece 16 is located over the partially completed integrated circuit package 10 and bottom mold piece 18. The top mold piece 16 is preferably in place when its peripheral portions 19 are disposed adjacent the bottom mold piece and enclose the partially completed integrated circuit package 10.

Once the top and bottom mold pieces 16 and 18 are in place, a space 38 is created about the partially completed integrated circuit package 10. However, the shaped member 24 is shaped so that the top surface 36 of the integrated circuit 30 is substantially contacted by the abutting surface 40 of the shaped member 24. The shaped member 24 preferably does not contact the various electrical components located on the top surface 26 of the integrated circuit 30. This physical arrangement between the abutting surface 40 of the shaped member 24 and the top surface 36 of the integrated circuit 30 preferably leaves no space therebetween in which encapsulant can flow during a subsequent injection step. It is preferred that the shaped member 24 be shaped according to the top surface dimensions of the integrated circuit 30 so that the wires 34 remain within the space 38 defined by the mold and partially completed integrated circuit package 10. Thus, when encapsulant is injected into the mold 12 the wires 34 are covered by the encapsulant, and thereby protected by the encapsulant.

Once the top and bottom mold pieces 16 and 18 are in place so that the abutting surface 40 of the shaped member 24 is adjacent the top surface 36 of the integrated circuit 30, an injection mechanism injects the encapsulant into the mold. Preferably, the encapsulant is a thermoplastic resin, but may be some other encapsulant as known in the art. The encapsulant is preferably injected such as through the through-holes 20 of the mold and into the space 38 defined by the mold, the partially completed integrated circuit package 10, and the shaped member 24.

As the encapsulant is injected into the space 38, the encapsulant flows around the partially completed integrated circuit package 10, encompassing a number of electrical components thereon. As described above, however, the abutting surfaces 40 and 36 preferably prevent the encapsulant from flowing over and adhering to a substantial portion of the top surface 36 of the integrated circuit 30. Once the encapsulant is sufficiently cured the mold is removed from the complete integrated circuit package 13 as depicted in FIG. 4.

Figure 4:
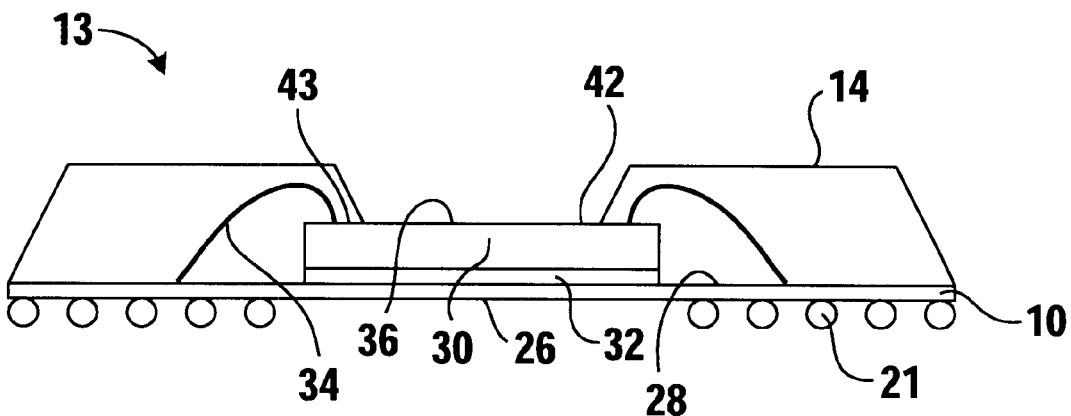
FIG. 4 is a cross-sectional view of the completed integrated circuit package including a molded body in accordance with the invention.

As shown in the cross-sectional view of FIG. 4, the complete integrated circuit package 13 includes the protective molded body 14. According to the invention, the protective molded body 14 is distinguished from the conventional protective coatings by the exposed portion 42 of the top surface 36 of the integrated circuit 30 which remains after removing the mold. The protective molded body 14 covers and protects the wires 34, electrical interconnection system 28, at least portions of the substrate 26, and at least a portion 43 of the integrated circuit 30.

The unique structure of the protective molded body 14 tends to allow the integrated circuit package 13 to dissipate heat in a highly efficient manner. It should be noted that the present invention is useful for a variety of integrated circuits, including flip-chips and wire bonded integrated circuits, and the invention is not intended to be limited to only the specific examples detailed herein.

Figure 5:
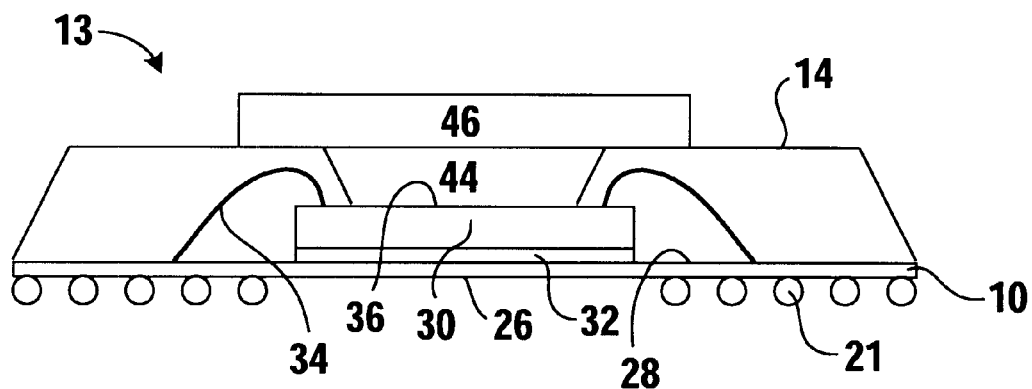
FIG. 5 is a cross-sectional view of the integrated circuit package, including heat dissipation components.

Referring now to FIG. 5, the integrated circuit package 13 may receive a thermally conductive material 44 that at least partially covers the exposed portion 42 of the top surface 36 of the integrated circuit 30. Preferably, the thermally conductive material 14 is selected so as to not damage the integrated circuit 30 in any manner, or to interfere with the proper operation of the integrated circuit 30. The thermally conductive material 44 preferably provides a medium for efficient heat conduction from the integrated circuit 30 of the integrated circuit package 13. Once the thermally conductive material 44 is in place, a heat sink 46 may be placed in contact with the thermally conductive material 44, for absorbing and dissipating the heat conducted through the thermally conductive material 44.

It is appreciated that it may be desirable in some applications to leave the top surface 42 of the integrated circuit 30 exposed. In this manner, the circulation of air or other fluid of the ambient environment is used to convect the heat produced by the operation of the integrated circuit 30 away from the integrated circuit 30.

Figure 6:
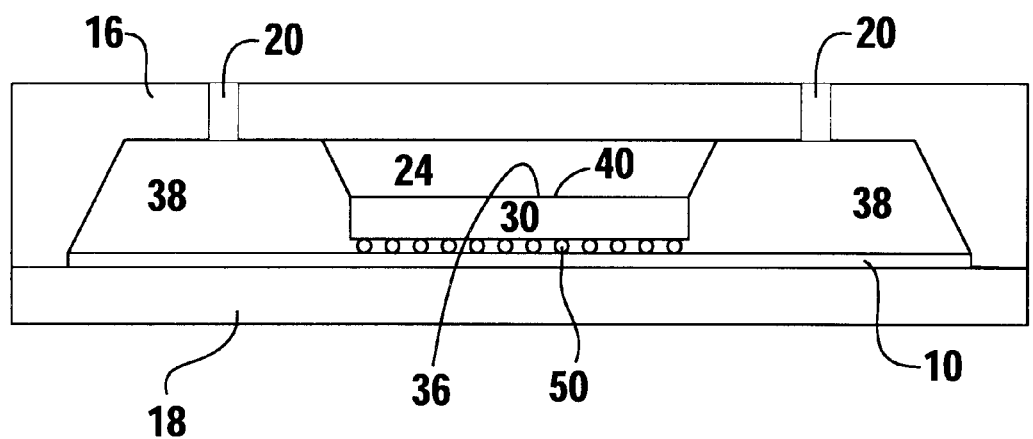
FIG. 6 is a cross-sectional view of another embodiment of the mold and partially completed integrated circuit package.

An alternate embodiment of the invention is shown in FIG. 6. According to this alternate embodiment, the shaped member 24 is a separate component from the top mold piece 16, such as a mold insert, which is disposed between the partially completed integrated circuit package 10 and the top mold piece 16.

In this alternate embodiment, the partially completed integrated circuit package 10 includes a flip-chip integrated circuit 30. Again, the shaped member 24 is fashioned to abut against the upper surface 36 of the flip-chip integrated circuit 30. The flip-chip 30 preferably does not have wire bonded connections on the upper surface. Instead, the flip-chip 30 is connected to the substrate 26 and the electrical interconnection system 28 through an arrangement of electrical connections 50, such as the solder bumps depicted. Accordingly, the shaped member 24 is configured so that the abutting surface 40 preferably contacts substantially all of the upper surface 36 of the flip-chip integrated circuit 30, since there are no wires to design around in this embodiment.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a mold for use in encapsulating a wire-bonded integrated circuit, wherein an encapsulant is injected into the mold during packaging of the wire-bonded integrated circuit, the improvement to the mold comprising a shaped member having an abutting surface for contacting a wire-bonding surface of the wire-bonded integrated circuit and thereby substantially preventing encapsulant from adhering to at least a portion of the wire-bonding surface of the wire-bonded integrated circuit, whereby the portion of the wire-bonding surface of the wire-bonded integrated circuit is left exposed through the encapsulant.

2. The mold of claim 1, wherein the shaped member comprises an integral portion of the mold.

3. The mold of claim 1, wherein the shaped member comprises an insert to the mold.

4. The mold of claim 1, wherein the shaped member is formed of silicone.

5. The mold of claim 1, wherein the shaped member does not contact a portion of the wire-bonding surface of the wire-bonded integrated circuit on which electrical connections to the wire-bonded integrated circuit are made.

* * * * *